(12) United States Patent
Knipper et al.

(10) Patent No.: US 12,027,490 B2
(45) Date of Patent: Jul. 2, 2024

(54) SEMICONDUCTOR DEVICE AND METHOD FOR FABRICATING THE SAME

(71) Applicant: Infineon Technologies AG, Neubiberg (DE)

(72) Inventors: Richard Knipper, Regensburg (DE); Alexander Heinrich, Bad Abbach (DE); Thorsten Scharf, Lappersdorf (DE); Stefan Schwab, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 169 days.

(21) Appl. No.: 17/390,101

(22) Filed: Jul. 30, 2021

(65) Prior Publication Data

US 2022/0045031 A1 Feb. 10, 2022

(30) Foreign Application Priority Data

Aug. 10, 2020 (EP) .................................... 20190296

(51) Int. Cl.
*H01L 23/00* (2006.01)

(52) U.S. Cl.
CPC .............. *H01L 24/85* (2013.01); *H01L 24/45* (2013.01); *H01L 24/48* (2013.01); *H01L 2224/45033* (2013.01); *H01L 2224/48472* (2013.01); *H01L 2224/85205* (2013.01); *H01L 2224/85214* (2013.01); *H01L 2224/85825* (2013.01)

(58) Field of Classification Search
CPC ......... H01L 24/85; H01L 24/45; H01L 24/48; H01L 24/05; H01L 24/40; H01L 24/77; H01L 24/78

See application file for complete search history.

(56) References Cited

U.S. PATENT DOCUMENTS

| 2004/0150082 A1* | 8/2004 | Kajiwara | ................ H01L 24/97 257/E23.044 |
| 2016/0358890 A1* | 12/2016 | Heinrich | ........... H01L 23/49524 |
| 2018/0158762 A1 | 6/2018 | Tonedachi | |
| 2019/0035764 A1* | 1/2019 | Riedl | .................. B23K 1/0016 |

FOREIGN PATENT DOCUMENTS

| EP | 0150305 A1 | 8/1985 |
| JP | 2011101894 A | 5/2011 |

OTHER PUBLICATIONS

"Bonding Wire Product Guide 2015-A", TopLine Corporation, Feb. 2015-A, 1-32.

* cited by examiner

*Primary Examiner* — Marc Anthony Armand
(74) *Attorney, Agent, or Firm* — Murphy, Bilak & Homiller, PLLC

(57) ABSTRACT

A method for fabricating a semiconductor device includes providing a semiconductor die, arranging an electrical connector over the semiconductor die, the electrical connector including a conductive core, an absorbing feature arranged on a first side of the conductive core, and a solder layer arranged on a second side of the conductive core, opposite the first side and facing the semiconductor die, and soldering the electrical connector onto the semiconductor die by heating the solder layer with a laser, wherein the laser irradiates the absorbing feature and absorbed energy is transferred from the absorbing feature through the conductive core to the solder layer.

15 Claims, 4 Drawing Sheets

SEMICONDUCTOR DEVICE AND METHOD FOR FABRICATING THE SAME

TECHNICAL FIELD

This disclosure relates in general to semiconductor devices as well as to methods for fabricating semiconductor devices.

BACKGROUND

A method for fabricating a semiconductor device may for example comprise an act of coupling a semiconductor die and an electrical connector to one another. This act of coupling may comprise heating the electrical connector by using e.g. ultrasonic excitation in order to form a welded joint or a solder joint. Furthermore, the electrical connector may have a comparatively high thickness in order to provide high ampacity and/or high robustness. This may make soldering or welding the electrical connector to the semiconductor die problematic because a comparatively high amount of energy may be necessary in order to form the solder joint or welded joint, respectively. Excessive heat (e.g. temperatures necessary for welding) and/or excessive mechanical stress (e.g. caused by ultrasonic excitation) may damage the semiconductor die. Improved semiconductor devices and improved methods for fabricating semiconductor devices may help with solving these and other problems.

The problem on which the invention is based is solved by the features of the independent claims. Further advantageous examples are described in the dependent claims.

SUMMARY

Various aspects pertain to a method for fabricating a semiconductor device, the method comprising: providing a semiconductor die, arranging an electrical connector over the semiconductor die, the electrical connector comprising a conductive core, an absorbing feature arranged on a first side of the conductive core, and a solder layer arranged on a second side of the conductive core, opposite the first side and facing the semiconductor die, and soldering the electrical connector onto the semiconductor die by heating the solder layer with a laser, wherein the laser irradiates the absorbing feature and absorbed energy is transferred from the absorbing feature through the conductive core to the solder layer.

Various aspects pertain to a semiconductor device, comprising: a semiconductor die, and an electrical connector arranged over the semiconductor die, the electrical connector comprising a conductive core, an absorbing feature arranged on a first side of the conductive core and facing away from the semiconductor die, and a solder joint arranged on a second side of the conductive core, opposite the first side and coupling the electrical connector to the semiconductor die.

BRIEF DESCRIPTION OF THE DRAWINGS

The accompanying drawings illustrate examples and together with the description serve to explain principles of the disclosure. Other examples and many of the intended advantages of the disclosure will be readily appreciated as they become better understood by reference to the following detailed description. The elements of the drawings are not necessarily to scale relative to each other. Identical reference numerals designate corresponding similar parts.

DETAILED DESCRIPTION

Figure 1:
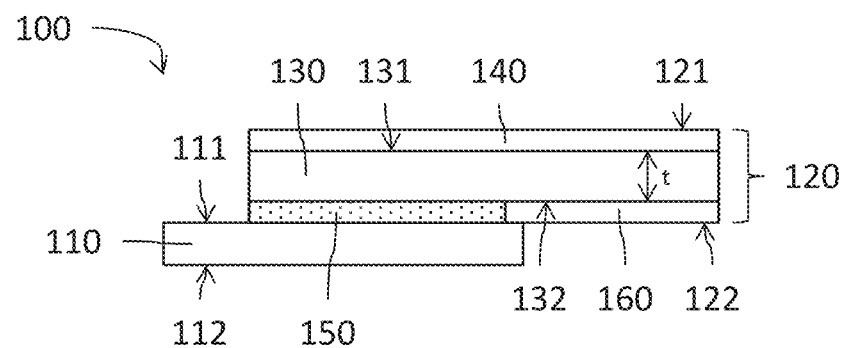
FIG. 1 shows a side view of a semiconductor device comprising a semiconductor die and an electrical connector coupled to the semiconductor die.

In the following detailed description, directional terminology, such as "top", "bottom", "left", "right", "upper", "lower" etc., may be used with reference to the orientation of the Figure(s) being described. Because components of the disclosure can be positioned in a number of different orientations, the directional terminology is used for purposes of illustration only. It is to be understood that other examples may be utilized and structural or logical changes may be made.

In addition, while a particular feature or aspect of an example may be disclosed with respect to only one of several implementations, such feature or aspect may be combined with one or more other features or aspects of the other implementations as may be desired and advantageous for any given or particular application, unless specifically noted otherwise or unless technically restricted. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives thereof may be used. It should be understood that these terms may be used to indicate that two elements cooperate or interact with each other regardless whether they are in direct physical or electrical contact, or they are not in direct contact with each other; intervening elements or layers may be provided between the "bonded", "attached", or "connected" elements. However, it is also possible that the "bonded", "attached", or "connected" elements are in direct contact with each other. Also, the term "exemplary" is merely meant as an example, rather than the best or optimal.

The examples of a semiconductor device may use various types of semiconductor dies or circuits incorporated in the semiconductor dies, among them AC/DC or DC/DC converter circuits, power MOS transistors, power Schottky diodes, JFETs (Junction Gate Field Effect Transistors), power bipolar transistors, logic integrated circuits, analogue integrated circuits, mixed signal integrated circuits, sensor circuits, power integrated circuits, chips with integrated passives, etc. The examples may also use semiconductor dies comprising MOS transistor structures or vertical transistor structures like, for example, IGBT (Insulated Gate Bipolar Transistor) structures or, in general, transistor structures in which at least one electrical contact pad is arranged on a first main face of the semiconductor die and at least one other electrical contact pad is arranged on a second main face of the semiconductor die, opposite to the first main face of the semiconductor die. The examples of a semiconductor device may also use semiconductor dies, wherein all contact pads are arranged on the same side.

The semiconductor die(s) may be manufactured from specific semiconductor material, for example Si, SiC, SiGe, GaAs, GaN, or from any other semiconductor material.

The semiconductor devices described below may include one or more semiconductor dies. By way of example, one or more power semiconductor dies may be included. Further, one or more logic integrated circuits may be included in the semiconductor devices. The logic integrated circuits may be configured to control the integrated circuits of other semiconductor dies, for example the integrated circuits of power semiconductor dies.

FIG. 1 shows a semiconductor device 100 comprising a semiconductor die 110 and an electrical connector 120. The electrical connector 120 is arranged over the semiconductor die 110, for example such that a first side 111 of the semiconductor die 110 faces a second side 122 of the electrical connector 120. A second side 112 of the semiconductor die 110, opposite the first side 111, may face away from the electrical connector 120. A first side 121 of the electrical connector 120, opposite the second side 122, may face away from the semiconductor die 110.

The electrical connector 120 comprises a conductive core 130, an absorbing feature 140 arranged on a first side 131 of the conductive core 130, wherein the first side 131 faces away from the semiconductor die 110, and a solder joint 150 arranged on a second side 132 of the conductive core 130, opposite the first side, wherein the solder joint 150 couples the electrical connector 120 to the semiconductor die 110.

According to an example, the electrical connector 120 comprises a solder layer 160 arranged on the second side 132 of the conductive core 130, wherein the solder joint 150 is part of the solder layer 160 (in other words, the solder joint 150 is formed out of material of the solder layer 160). It is possible that the solder joint 150 furthermore comprises some material from the semiconductor die 110 and/or some material from the conductive core 130 and/or from the absorbing feature 140 (this may in particular be the case if the electrical connector 120 is attached to the semiconductor die 110 during the laser process: partial melting or at least interdiffusion might occur, thus the final solder joint 150 may comprise solder material, core material, absorbing feature material and chip front side material in some cases).

According to an example, the absorbing feature 140 comprises or consists of an absorbing layer or an antireflection layer arranged on the first side 131 of the conductive core 130. According to another example, the absorbing feature 140 is a feature of the first side 131 of the conductive core 130 itself, e.g. a particular surface roughness, curvature, material composition etc. which facilitates the uptake of laser energy by the conductive core 130 and/or the solder joint 150. The absorbing feature 140 may completely cover the first side 131 of the conductive core. However, it is also possible that the absorbing feature 140 covers only part of the first side 131. The solder joint 150 and/or the solder layer 160 alone or in combination may completely cover the second side 132 of the conductive core. However, it is also possible that part of the second side 132 is exposed from the solder joint 150 and/or the solder layer 160.

The semiconductor die 110 may for example be a power semiconductor die that is configured to operate with a high electrical voltage and/or a high electrical current. The semiconductor die 110 may for example be a diode or an IGBT. The semiconductor die 110 may have any suitable thickness measured between the first side 111 and the second side 112, e.g. a thickness of 1 mm or less, 500 µm or less, 200 µm or less, 100 µm or less, or 50 µm or less.

The semiconductor die 110 may comprise a first power electrode arranged on the first side 111, wherein the electrical connector 120 is coupled to the first power electrode by the solder joint 150. The semiconductor die 110 may comprise a second power electrode arranged on the second side 112. The first and second power electrodes may for example be a source electrode, drain electrode, emitter electrode, or collector electrode.

The first power electrode of the semiconductor die 110 may comprise one or more metallization layers, wherein the solder joint 150 is arranged on the outermost of the one or more metallization layers. The outermost metallization layer may for example comprise or consist of Al or Cu.

The semiconductor die 110 may further comprise a control electrode, e.g. a gate electrode, which may for example be arranged on the first side 111, laterally besides the first power electrode. The semiconductor device 100 may comprise a further electrical connector, e.g. a bond wire, coupled to the control electrode.

According to an example, the conductive core 130 of the electrical connector 120 comprises a ribbon, a wire, or a contact clip. The conductive core 130 may for example have a thickness t of 150 µm or more, 200 µm or more, 250 µm or more, or 300 µm or more, or 500 µm or more.

According to an example, the conductive core 130 comprises or consists of Al or Cu. The conductive core 130 and the outermost metallization layer of the first power electrode may comprise or consist of the same metal or metal alloy or they may comprise or consist of different metals or metal alloys.

The absorbing feature 140 and/or the solder layer 160 may have any suitable thickness, e.g. a thickness of 500 µm or less, 200 µm or less, 100 µm or less, 50 µm or less, 10 µm or less, 1 µm or less, or 500 nm or less. The absorbing feature 140 and the solder layer 160 may have an identical thickness or different thicknesses. Furthermore, a thickness of the solder joint 150 may be identical or similar to the thickness of the solder layer 160.

The conductive core 130 may be primarily configured as an electrical conductor. The absorbing feature 140 may be primarily configured to have good absorbing characteristics for a laser beam. In particular, an absorptance for the laser beam of the absorbing feature 140 may be higher than an absorptance for the laser beam of the conductive core 130.

The solder joint 150 may be formed fully or at least partially by using a laser beam to heat the material of the solder layer 160. As described with greater detail further below, a laser beam may be directed at the absorbing feature 140 and absorbed energy may be transferred from the absorbing feature 140 through the conductive core 130 to the solder layer 160 or the absorbing feature 140 may at least improve the uptake of laser energy by the solder layer 160 and thereby facility the formation of the solder joint 150. Using a laser to fabricate the solder joint 150 may be advantageous compared to e.g. using ultrasound as a heat source. Using e.g. ultrasound emitted from an ultrasound bondhead may exert a comparatively high mechanical pressure and/or mechanical stress on the semiconductor die 110 and may therefore damage the semiconductor die 110. By using a laser as a heat source on the other hand, such high pressure and/or stress may be avoided.

Furthermore, by providing a solder layer 160 comprising a material with a melting point that is lower than a melting point of the material of the conductive core, it may be possible to reduce the amount of heat necessary to fabricate a bond between the semiconductor die 110 and the electrical connector 120. For example, if the solder layer 160 was omitted and the conductive core 130 was to be welded to the semiconductor die 110, it would be necessary to heat up the conductive core 130 to e.g. 1085° C. (the melting point of Cu). However, since the electrical connector 120 is soldered to the semiconductor die 110, it may only be necessary to heat up the solder layer 150 to e.g. a temperature in the range of 180° C. to 430° C. In other words, the absorbed energy may be sufficient to melt the material of the solder layer 160 but insufficient to melt the material of the conductive core 130. For these reasons, damaging the semiconductor die 110 by excessive heat may be avoided.

According to an example, the absorbing feature 140 comprises or consists of a polymer. According to another example, the absorbing feature 140 comprises or consists of an oxide layer (e.g. a natural oxide layer or a deposited oxide layer) like SnO, a solder layer (e.g. a Sn layer), or a Ni layer. According to an example, the absorbing feature 140 and the solder layer 160 are the same layer (i.e. they comprise the same material). According to another example, they are different layers comprising different materials, e.g. a polymer for the absorbing feature 140 and solder material for the solder layer 160. According to an example, the absorbing feature 140 and/or the solder layer 160 are sputtered, printed, dip coated (by dipping the conductive core 130 into molten material) or galvanically deposited on the conductive core 130.

According to an example, the solder layer 150 comprises or consists of Sn, In, Bi, Sb, Zn, Pb, or an alloy of one or more of these metals. The solder layer 150 may comprise a soft solder material, a diffusion solder material, or a hard solder material.

In the case that the solder joint 150 is a diffusion solder joint, the solder joint 150 may comprise one or more intermetallic compounds (IMCs), e.g. an IMC comprising Cu and Sn like $Cu_3Sn$. A diffusion solder joint may be formed by melting the solder layer 160 with the laser beam. Once the material is melted, the components of the solder layer 160 as well as material of the conductive core 130 and of the metallization layer of the semiconductor die 110 can diffuse into each other forming a new alloy with different composition. The new alloy (i.e. the IMC) may have a higher melting temperature than the original solder layer 160.

Figure 2:
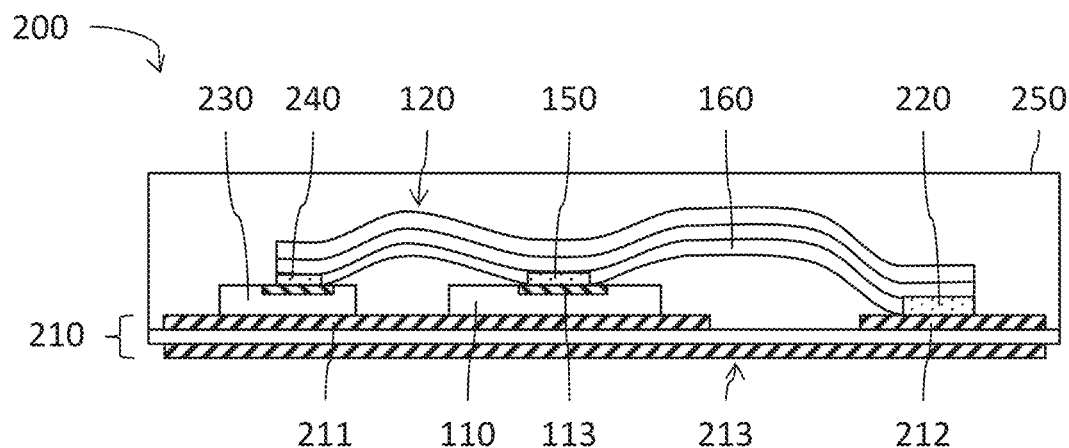
FIG. 2 shows a side view of a further semiconductor device, wherein the semiconductor die is arranged on a carrier and wherein the electrical connector couples the semiconductor die to the carrier.

FIG. 2 shows a further semiconductor device 200 which may be similar to or identical with the semiconductor device 100. The semiconductor device 200 comprises all components described with respect to FIG. 1 and it additionally comprises a carrier 210.

The carrier 210 may for example comprise a DCB (direct copper bond), DAB (direct aluminum bond), AMB (active metal brazing), or a leadframe. The semiconductor die 110 may be arranged on and electrically coupled to the carrier 210, e.g. to a first pad 211 of the carrier 210. The electrical connector 120 may e.g. be coupled to a second pad 212 of the carrier 210 and may be configured to electrically connect the first power electrode of the semiconductor die 110 with the second pad 212. A second solder joint 220 may be used to couple the electrical connector to the second pad 212. The second solder joint 220 may be structurally identical with the solder joint 150 or it may have a different structure and/or material composition than the solder joint 150. In particular, the second solder joint 220 may also be fabricated by using a laser beam to heat up the solder layer 160. However, it is also possible that the second solder joint 220 is fabricated without the use of a laser, e.g. by heating up the solder layer 160 using ultrasonic excitation.

The semiconductor device 200 may optionally include a second semiconductor die 230. The second semiconductor die 230 may for example be a power semiconductor die or a power diode. The semiconductor die 110 and the second semiconductor die 230 may be electrically coupled to one another by the electrical connector 120 and/or the first pad 212.

The electrical connector 120 may be coupled to the second semiconductor die 230 by a third solder joint 240. The third solder joint 240 may have the same structure and the same material composition as the solder joint 150 and/or the second solder joint 220. In particular, the third solder joint 240 may also be fabricated by using the laser beam to heat up the solder layer 160.

According to an example, the second semiconductor die 230 is a diode configured to act as a protective diode for the semiconductor die 110. In this case the semiconductor die 110 may e.g. comprise an IGBT. According to another example, the second semiconductor die 230 comprises a power transistor circuit. In this case the semiconductor dies 110, 230 may be coupled together by the electrical connector 120 to form an electrical circuit like a half-bridge circuit.

The semiconductor die 110 may comprise a metallization 113 arranged on the first side 111. The metallization 113 may be part of the first power electrode of the semiconductor die 110. The metallization 113 may correspond to the outermost metallization layer of the first power electrode. The metallization 113 may e.g. comprise or consist of Al, Cu or Ni. The metallization 113 may for example have a thickness (measured perpendicular to the first side 111) of 20 μm or less, 15 μm or less, or 10 μm or less. As shown in FIG. 2, the electrical connector 120 may be coupled to the metallization 113 by the solder joint 150.

The semiconductor device 200 may optionally include an encapsulation 250 encapsulating the semiconductor die 110. The encapsulation 250 may further encapsulate the electrical connector 120 and/or the second semiconductor die 230. However, it is also possible that the electrical connector 120 is at least partially exposed from the encapsulation 250. The carrier 210 may be fully encapsulated by the encapsulation 250 or it may be at least partially exposed from the encapsulation 250. The encapsulation 250 may for example comprise a plastic frame and/or a molded body.

The semiconductor device 200 may optionally comprise a base plate arranged on a lower surface 213 of the carrier 210. The base plate may e.g. be coupled to the carrier by a further solder joint. Furthermore, the semiconductor device 200 may optionally comprise a heatsink arranged below the base plate. A layer of thermal interface material (TIM) may be arranged between the base plate and the heatsink. According to another example, the semiconductor device 200 does not comprise a base plate and the heatsink is instead arranged on the carrier 210.

Figure 3A:
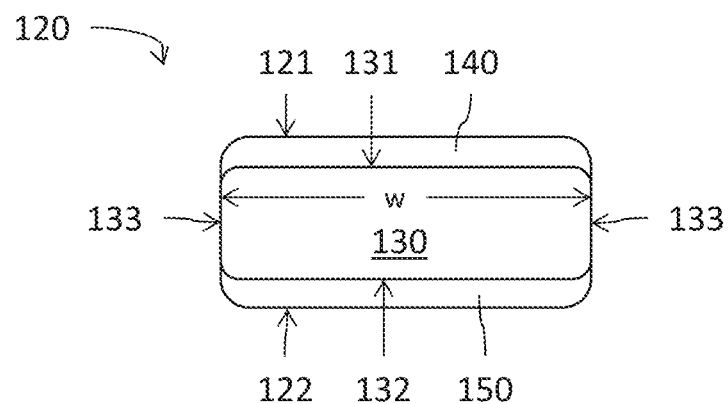
FIGS. 3A and 3B show cross-sectional views of examples of the electrical connector of FIGS. 1 and 2.
Figure 3B:
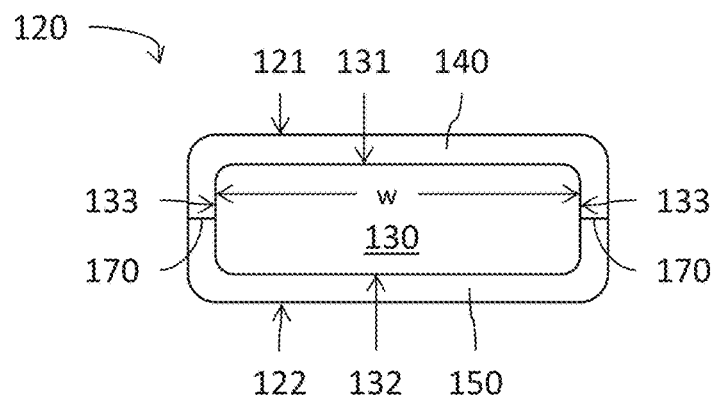

FIGS. 3A and 3B show cross-sectional views of two different examples of the electrical connector 120. According to these examples, the electrical connector 120 essentially has a rectangular cross section. However, any other suitable shape is also possible, e.g. a quadratic, round, oval, etc. cross section. The electrical connector 120 does not necessarily have an oblong shape. The electrical connector 120 may have any suitable width w, for example a width of 100 μm or more, 200 μm or more, 500 μm or more, or 1 mm or more.

In the example shown in FIG. 3A, the absorbing feature 140 is arranged on the first side 131 of the conductive core 130 but not on lateral sides 133. Likewise, the solder joint 150 (and the solder layer 160, respectively) is arranged on the second side 132 of the conductive core 130 but not on the lateral sides 133.

According to another example, the lateral sides 133 are at least partially covered by the absorbing feature 140 and/or the solder layer 160. The lateral sides 133 may also be covered by a further layer that is different from the absorbing feature 140 and the solder layer 160, e.g. by a natural oxide layer.

In the example shown in FIG. 3B, the absorbing feature 140 covers the first side 131 and also at least part of the lateral sides 133 of the conductive core 130. Likewise, the solder joint 150 (respectively the solder layer 160) covers the second side 132 and also at least part of the lateral sides 133 of the conductive core 130. The absorbing feature 140 and the solder joint 150 (or solder layer 160) may be in direct contact with each other at the lateral sides along an interface 170. The interface 170 may e.g. be arranged essentially perpendicular to the lateral sides 133 or it may be inclined with respect to the lateral sides 133. In the case that the absorbing feature 140 and the solder layer 160 are comprised of the same material, the interface 170 might not be present.

According to the example shown in FIG. 3B, the absorbing feature 140 and the solder joint 150 or solder layer 160 may essentially have the same thickness at the lateral sides 133. However, it is also possible that one of the two layers is thicker than the other.

FIGS. 4A to 4F show a semiconductor device 400 in various stages of fabrication according to an exemplary method for fabricating semiconductor devices. The semiconductor device 400 may be similar to or identical with the semiconductor devices 100 and 200.

Figure 4A:
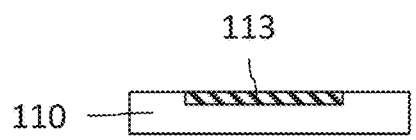
FIGS. 4A to 4F show a semiconductor device in various stages of fabrication according to an exemplary method for fabricating semiconductor devices.

As shown in FIG. 4A, the semiconductor die 110 is provided. This may comprise singulating the semiconductor die 110 from a semiconductor wafer. The semiconductor die 110 may comprise the metallization 113.

Figure 4B:
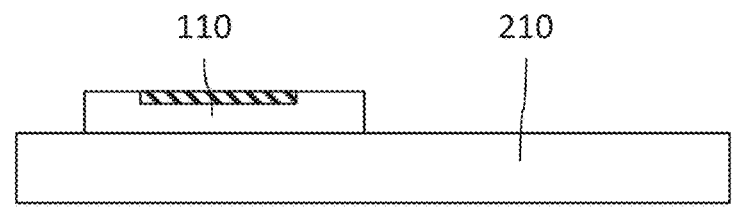

As shown in FIG. 4B, the semiconductor die 110 is arranged on the carrier 210. This may comprise soldering, gluing, welding or sintering the semiconductor die 110 to the carrier 210.

Figure 4C:
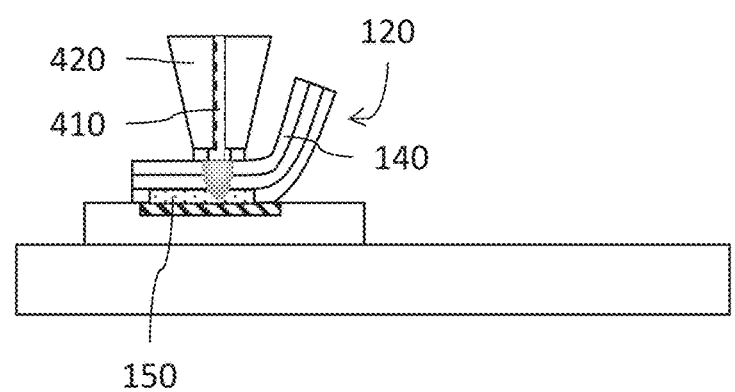

As shown in FIG. 4C, the electrical connector 120 is soldered to the semiconductor die 110, for example to the metallization 113. This comprises irradiating the absorbing feature 140 with a laser beam 410. According to an example, the process is performed in ambient atmosphere or in a reducing atmosphere (suppression of native oxide may improve the results of the solder joint formation). According to an example, the electrical connector 120 is arranged on the semiconductor die 110 using a bondhead 420 of e.g. a wire bonding equipment. The electrical connector 120 may for example be provided as part of a strip, wherein the electrical connector 120 is singulated by cutting through the strip as described further below. According to the example shown in FIG. 4C, the solder layer 160 is already arranged on the conductive core 130 when the electrical connector 120 is arranged on the semiconductor die 110. According to another example, the solder material is instead arranged on the semiconductor die 110 (e.g. in the form of a solder deposit or a preform) and the electrical connector 120 (without the solder layer 160) is arranged on the solder material.

Furthermore, it is possible that the electrical connector 120 already comprises structures when it is arranged over the semiconductor die 110. Such structures may for example comprise a greater thickness of those parts of the electrical connector 120 that are arranged over a solder joint than of those parts that form a span over the semiconductor die 110 or over the carrier 210. Furthermore, such structures may e.g. comprise a structured solder layer 160 which does not cover the second side 132 of the conductive core completely but only those parts of the second side 132 where a solder joint is to be formed.

According to an example, the laser beam 410 is guided onto the absorbing feature 140 through the bondhead 420. For this purpose, the bondhead 410 may be equipped with a laser fiber. According to another example, the laser fiber is not part of the bondhead 420.

The energy of the laser beam 410 may be partially or fully absorbed by the absorbing feature 140 and is transferred from the absorbing feature 140 through the conductive core 130 to the solder layer 160 which consequently heats up. Once a sufficient amount of energy from the laser beam 410 is absorbed, the material of the solder layer 160 may melt or at least material diffusion and intermetallic phase formation may set in and the solder joint 150 is formed. For example, an energy density of about 25 J/cm$^2$ may be necessary in order to reach a temperature of 300° C. in the material of the solder layer 160 and each pulse of the laser beam 410 may provide between 1 and 1.5 J/cm$^2$ (using e.g. a kHz pulse rate laser setup). In this case about 20 pulses are necessary to form the solder joint 150 (heat dissipation need not be an issue due to the high pulse rate). The conductive core 130 may act as a "heat spreader" and the solder layer 160 may act as a "thermal buffer" for the energy of the laser beam 410. Therefore, the semiconductor die 110 may be protected from excessive heat.

The energy of the laser beam 410 may produce morphology changes (i.e. a modification of the crystalline structure) in the absorbing feature 140 and/or the conductive core 130 and/or the solder layer 160. These changes may clearly deviate from morphology changes ultrasonic excitation would produce in the electrical connector 120. By analyzing the morphology changes in the electrical connector 120 above the solder joint 150, one can therefore unequivocally determine if a laser beam was used to fabricate the solder joint 150.

According to an example, no downward pressure or almost no downward pressure is exerted by the bondhead 420 onto the electrical connector 120 and semiconductor die 110. For example, the bondhead 420 only presses down gently such that the electrical connector 120 and the semiconductor die 110 are in direct contact and surface conformity is assured. However, due to using the laser beam 410 to melt the solder layer 160, no comparatively high pressure has to be exerted by the bondhead 420 in order to facilitate the fabrication of the solder joint 150 as might be necessary in the case that ultrasonic excitation was used instead of the laser beam 410.

According to an example, ultrasonic excitation may be used in addition to the laser beam 410 in order to fabricate the solder joint 150. In this case, the bondhead 420 may be configured to guide the laser beam 410 onto the electrical connector 120 and additionally to guide ultrasound onto the electrical connector 120. However, the energy for melting the solder layer 160 may still primarily be provided by the laser beam 410, whereas the ultrasound only acts as an additional energy source which supports the formation of the solder joint 150.

Figure 4D:
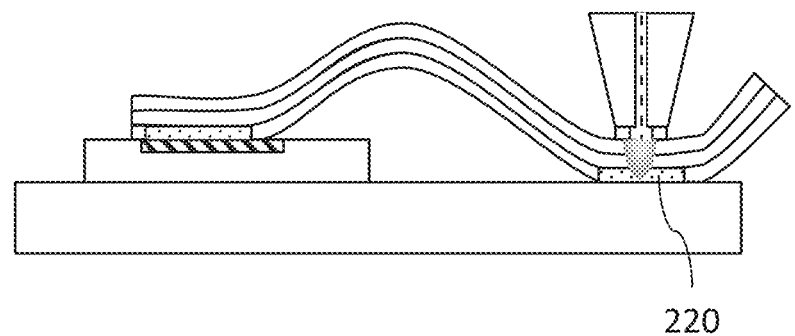

As shown in FIG. 4D, the electrical connector may be soldered to the carrier 210. The bondhead 420 may be used to form the second solder joint 220 in the same manner as described above with respect to the solder joint 150. It is also possible that the electrical connector 120 is not soldered to the carrier 120 but instead to a different component of the semiconductor device 400, e.g. to a second semiconductor die or to any other suitable conducting element.

Figure 4E:
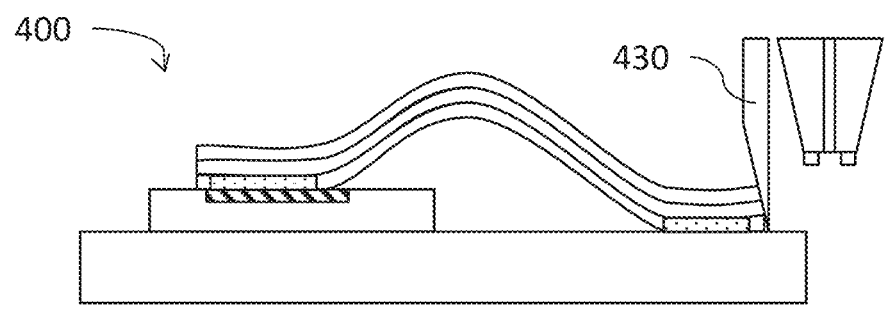

As shown in FIG. 4E, the electrical connector is singulated by cutting with a cutting blade 430. The cutting blade 430 may be a part of the bondhead 420. In the case that the electrical connector 120 does not comprise a ribbon or a wire but e.g. a contact clip, it may not be necessary to singulate the electrical connector 120 at this point because it may already be a singulated piece.

Figure 4F:
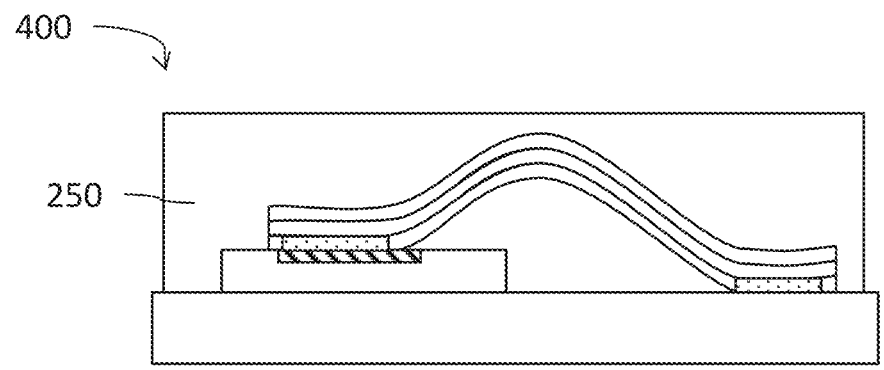

As shown in FIG. 4F, the semiconductor device 400 may optionally comprise the encapsulation 250. The encapsulation 250 may be provided after the electrical connector 120 has been soldered to the semiconductor die 110 and to the carrier 210.

Figure 5:
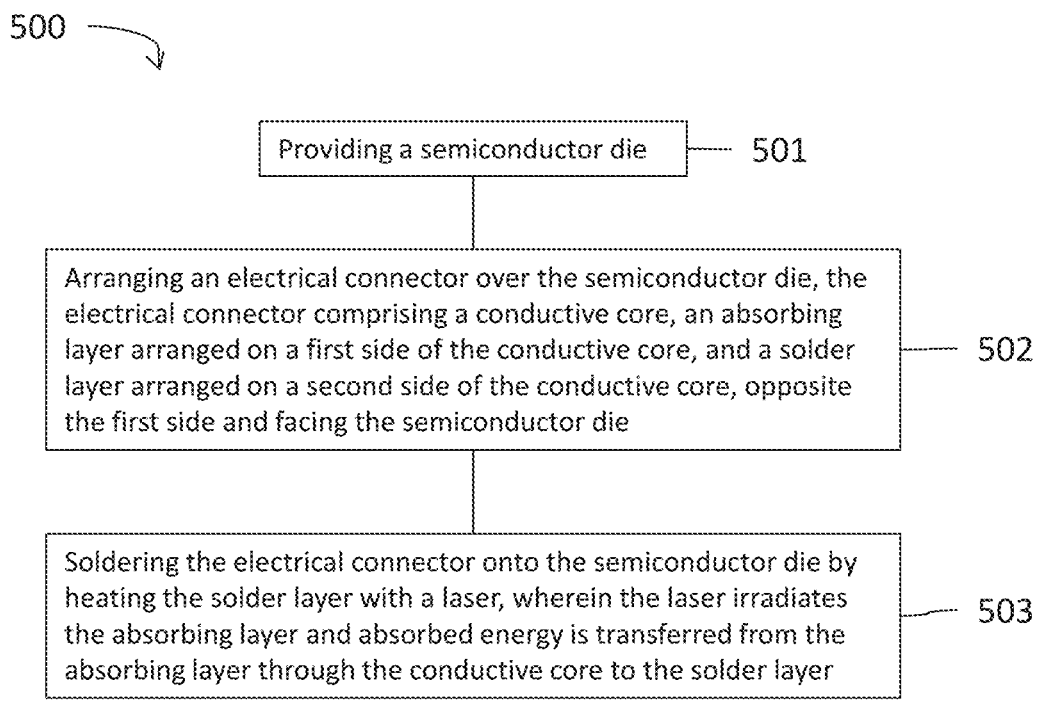
FIG. 5 is a flow chart of an exemplary method for fabricating a semiconductor device.

FIG. 5 is a flow chart of a method 500 for fabricating a semiconductor device. The method 500 may for example be used to fabricate the semiconductor devices 100, 200 and 400.

The method 500 comprises at 501 an act of providing a semiconductor die, at 502 an act of arranging an electrical connector over the semiconductor die, the electrical connector comprising a conductive core, an absorbing feature arranged on a first side of the conductive core, and a solder layer arranged on a second side of the conductive core, opposite the first side and facing the semiconductor die, and at 503 an act of soldering the electrical connector onto the semiconductor die by heating the solder layer with a laser, wherein the laser irradiates the absorbing feature and absorbed energy is transferred from the absorbing feature through the conductive core to the solder layer.

According to an example of the method 500, the material of the solder layer has a melting point that is lower than a melting point of the material of the conductive core and the absorbed energy is sufficient to melt the material of the solder layer but insufficient to melt the material of the conductive core. In other words, the electrical connector is soldered to the semiconductor die but it is not welded to it.

According to an example of the method 500, the absorbing feature and/or the solder layer are deposited on the conductive core prior to arranging the electrical connector over the semiconductor die. This depositing may for example be performed by sputtering, printing, or galvanic deposition.

In the following, the semiconductor device and the method for fabricating a semiconductor device are further explained using specific examples.

Example 1 is a method for fabricating a semiconductor device, the method comprising: providing a semiconductor die, arranging an electrical connector over the semiconductor die, the electrical connector comprising a conductive core, an absorbing feature arranged on a first side of the conductive core, and a solder layer arranged on a second side of the conductive core, opposite the first side and facing the semiconductor die, and soldering the electrical connector onto the semiconductor die by heating the solder layer with a laser, wherein the laser irradiates the absorbing feature and absorbed energy is transferred from the absorbing feature through the conductive core to the solder layer.

Example 2 is the method of example 1, wherein the material of the solder layer has a melting point that is lower than a melting point of the material of the conductive core, and wherein the absorbed energy is sufficient to melt the material of the solder layer but insufficient to melt the material of the conductive core.

Example 3 is the method of example 1 or 2, wherein an absorptance for the laser beam of the absorbing feature is higher than an absorptance for the laser beam of the conductive core.

Example 4 is the method of one of the preceding examples, wherein the absorbing feature comprises an absorbing layer or an antireflection layer, and wherein the absorbing layer or the antireflection layer comprises a polymer, a metal or a metal oxide.

Example 5 is the method of one of the preceding examples, wherein the soldering comprises diffusion soldering the electrical connector onto the semiconductor die.

Example 6 is the method of one of the preceding examples, wherein the electrical connector comprises a wire or a ribbon.

Example 7 is the method of one of the preceding examples, wherein the absorbing feature and/or the solder layer is sputtered, printed, cold rolled, dip coated or galvanically deposited on the conductive core.

Example 8 is the method of one of the preceding examples, wherein ultrasonic excitation is used in addition to the laser in order to heat the solder layer.

Example 9 is the method of one of the preceding examples, wherein the electrical connector is heated to a temperature of no more than 430° C.

Example 10 is the method of one of the preceding examples, wherein the electrical connector is arranged over the semiconductor die by a bondhead and wherein the laser is guided through the bondhead.

Example 11 is the method of one of the preceding examples, further comprising: providing the electrical connector as part of a strip, and after the soldering, singulating the electrical connector by cutting through the strip.

Example 12 is a semiconductor device, comprising: a semiconductor die, and an electrical connector arranged over the semiconductor die, the electrical connector comprising a conductive core, an absorbing feature arranged on a first side of the conductive core and facing away from the semiconductor die, and a solder joint arranged on a second side of the conductive core, opposite the first side and coupling the electrical connector to the semiconductor die.

Example 13 is the semiconductor device of example 12, wherein the conductive core has a thickness of 150 μm or more, measured between the first and second sides.

Example 14 is the semiconductor device of example 12 or 13, wherein the semiconductor die comprises a metallization, wherein the electrical connector is soldered to the metallization and wherein the metallization has a thickness of 10 μm or less.

Example 15 is the semiconductor device of one of examples 12 to 14, further comprising: an electrically conductive substrate, wherein the semiconductor die is arranged on the substrate and wherein the electrical connector electrically couples the semiconductor die to the substrate.

Example 16 is an apparatus comprising means for performing the method according to anyone of examples 1 to 11.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

What is claimed is:

1. A method for fabricating a semiconductor device, the method comprising:
providing a semiconductor die;
arranging an electrical connector over the semiconductor die, the electrical connector comprising a conductive core, an absorbing feature arranged on a first side of the conductive core, and a solder layer arranged on a second side of the conductive core, opposite the first side and facing the semiconductor die; and
soldering the electrical connector onto the semiconductor die by heating the solder layer with a laser,
wherein the laser irradiates the absorbing feature and absorbed energy is transferred from the absorbing feature through the conductive core to the solder layer.

2. The method of claim 1, wherein the material of the solder layer has a melting point that is lower than a melting point of the material of the conductive core, and wherein the absorbed energy is sufficient to melt the material of the solder layer but insufficient to melt the material of the conductive core.

3. The method of claim 1, wherein an absorptance for the laser beam of the absorbing feature is higher than an absorptance for the laser beam of the conductive core.

4. The method of claim 1, wherein the absorbing feature comprises an absorbing layer or an antireflection layer, and wherein the absorbing layer or the antireflection layer comprises a polymer, a metal or a metal oxide.

5. The method of claim 1, wherein the soldering comprises diffusion soldering the electrical connector onto the semiconductor die.

6. The method of claim 1, wherein the electrical connector comprises a wire, a ribbon or a sheet metal.

7. The method of claim 1, wherein the absorbing feature and/or the solder layer is sputtered, printed, cold rolled, dip coated or galvanically deposited on the conductive core.

8. The method of claim 1, further comprising:
using ultrasonic excitation, in addition to the laser, to heat the solder layer.

9. The method of claim 1, wherein the electrical connector is heated to a temperature of no more than 430° C.

10. The method of claim 1, wherein the electrical connector is arranged over the semiconductor die by a bondhead, and wherein the laser is guided through the bondhead.

11. The method of claim 1, further comprising:
providing the electrical connector as part of a strip; and
after the soldering, singulating the electrical connector by cutting through the strip.

12. A semiconductor device, comprising:
a semiconductor die; and
an electrical connector arranged over the semiconductor die, the electrical connector comprising a conductive core, an absorbing feature arranged on a first side of the conductive core and facing away from the semiconductor die, and a solder joint arranged on a second side of the conductive core, opposite the first side and coupling the electrical connector to the semiconductor die.

13. The semiconductor device of claim 12, wherein the conductive core has a thickness of 150 μm or more, measured between the first and second sides.

14. The semiconductor device of claim 12, wherein the semiconductor die comprises a metallization, wherein the electrical connector is soldered to the metallization, and wherein the metallization has a thickness of 10 μm or less.

15. The semiconductor device of claim 12, further comprising:
an electrically conductive substrate,
wherein the semiconductor die is arranged on the substrate, and
wherein the electrical connector electrically couples the semiconductor die to the substrate.

* * * * *